United States Patent [19]

Bonifanti et al.

[11] Patent Number: 4,551,901
[45] Date of Patent: Nov. 12, 1985

[54] COMPONENT INSERTION APPARATUS

[75] Inventors: George Bonifanti, Hummelstown; Mark F. Jackson, Harrisburg; Karl H. Letsch, Wyomissing; Bruce C. Longenecker, Harrisburg; Phillip E. Loomis, Harrisburg; Hung T. Nguyen, Harrisburg; Leo V. Schuppert, Jr., York; Richard V. Spong, Etters; Edward J. Paukovits, Jr., Hummelstown, all of Pa.

[73] Assignee: AMP Incorporated, Harrisburg, Pa.

[21] Appl. No.: 582,996

[22] Filed: Feb. 24, 1984

[51] Int. Cl.$^4$ .......................................... H05K 13/04
[52] U.S. Cl. .................................. 29/564.6; 29/566.2
[58] Field of Search .................... 29/33 M, 566, 566.1, 29/566.2, 566.3, 564.6, 564.7, 741, 739, 798, 29/822; 227/146, 147

[56] References Cited

U.S. PATENT DOCUMENTS

| | | | |
|---|---|---|---|
| 3,276,653 | 10/1966 | Lovendusky | 29/739 X |
| 3,605,237 | 9/1971 | Bakermans | 29/566.2 |
| 3,820,218 | 6/1974 | Serrano | 29/566.2 |
| 3,907,008 | 9/1975 | Batesehl | 29/566.3 X |
| 3,975,811 | 8/1976 | Meyer | 29/739 |
| 4,177,549 | 12/1979 | Mori et al. | 29/564.2 |
| 4,294,000 | 10/1981 | Takahashi | 29/564.6 |
| 4,365,398 | 12/1982 | Chisholm | 29/564.6 |
| 4,403,390 | 9/1983 | Woodman, Jr. | 29/564.1 |

FOREIGN PATENT DOCUMENTS

| | | | |
|---|---|---|---|
| 0014940A1 | 9/1980 | European Pat. Off. | 29/566.2 |
| 2036611A | 7/1980 | United Kingdom | 29/566.2 |
| 2114494 | 8/1983 | United Kingdom | 29/566.2 |

Primary Examiner—William R. Briggs
Attorney, Agent, or Firm—Jay L. Seitchik

[57] ABSTRACT

Apparatus for severing components from a strip of components and for inserting the severed components one by one into a work piece, comprises means for feeding the strip of components incrementally to a component severing station, means for severing the leading component from the strip at the severing station and an insertion tool for inserting the severed leading component into the work piece; all driven by a stepping motor through step down transmission means acting on a main cam shaft. A disc cam on the shaft has on opposite faces cam tracks receiving cam followers connected to the insertion tool and the severing means, the feeding means being driven through a barrel cam on the shaft. An electronic control unit monitors the angular position of the shaft.

7 Claims, 15 Drawing Figures

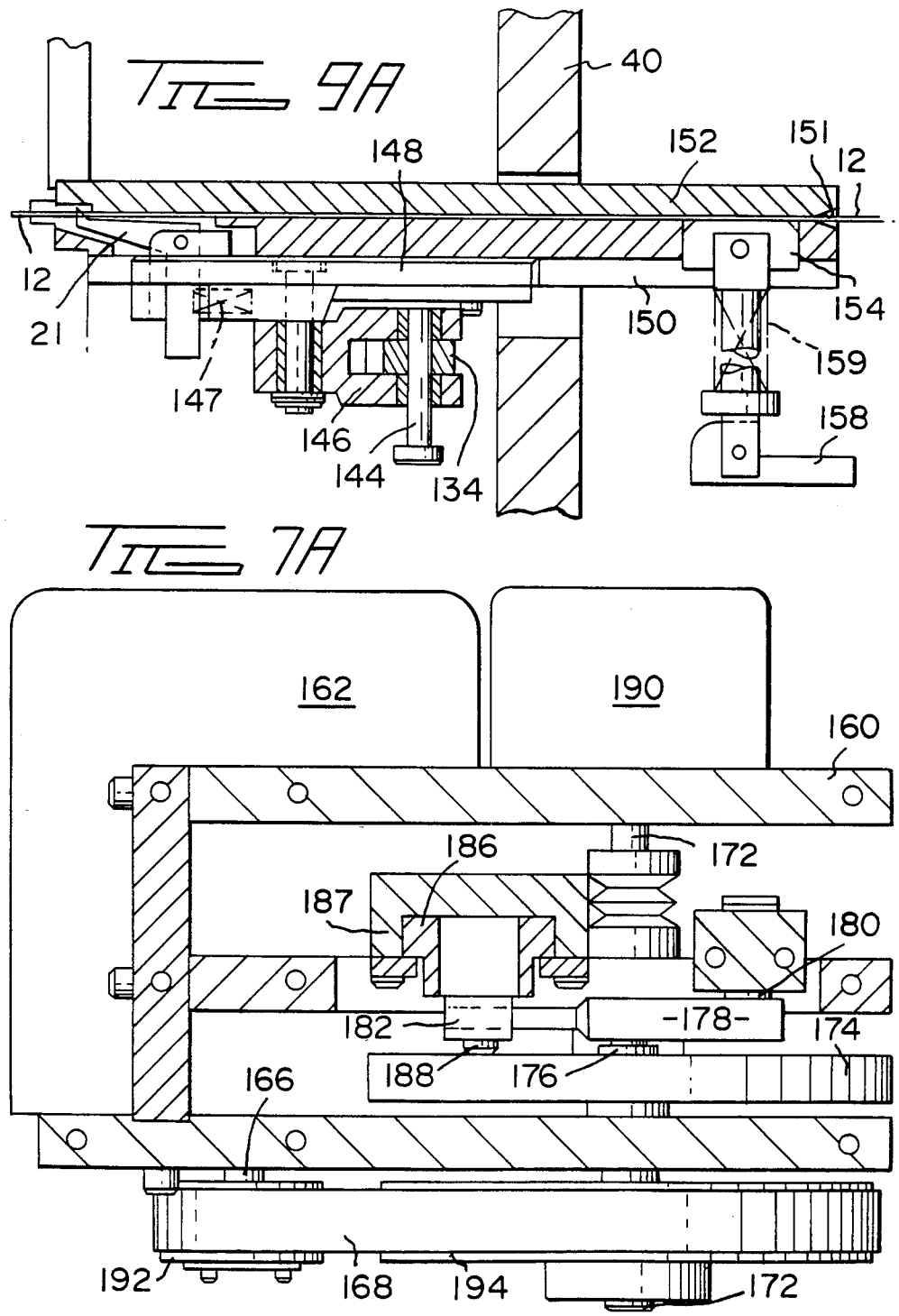

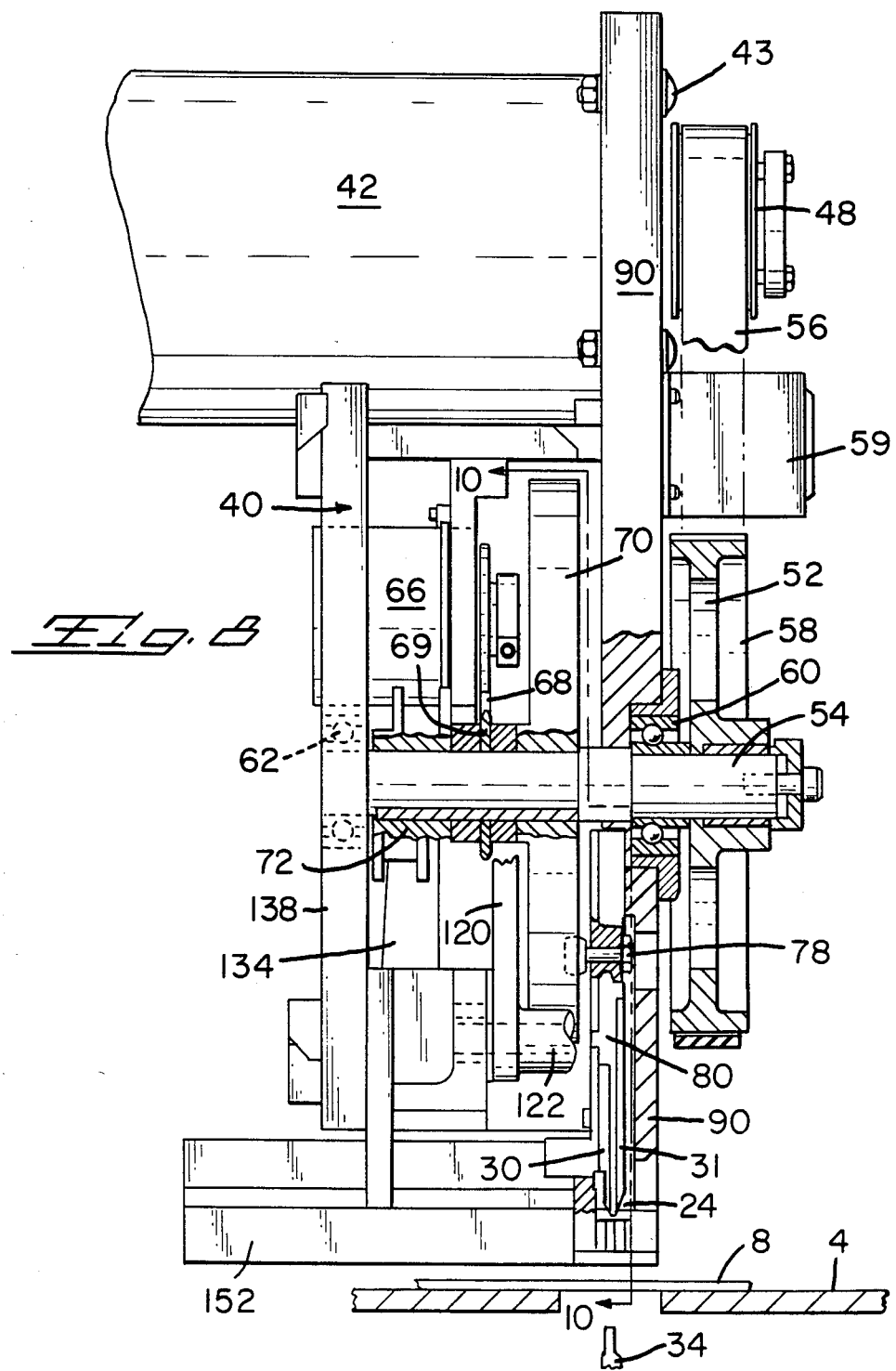

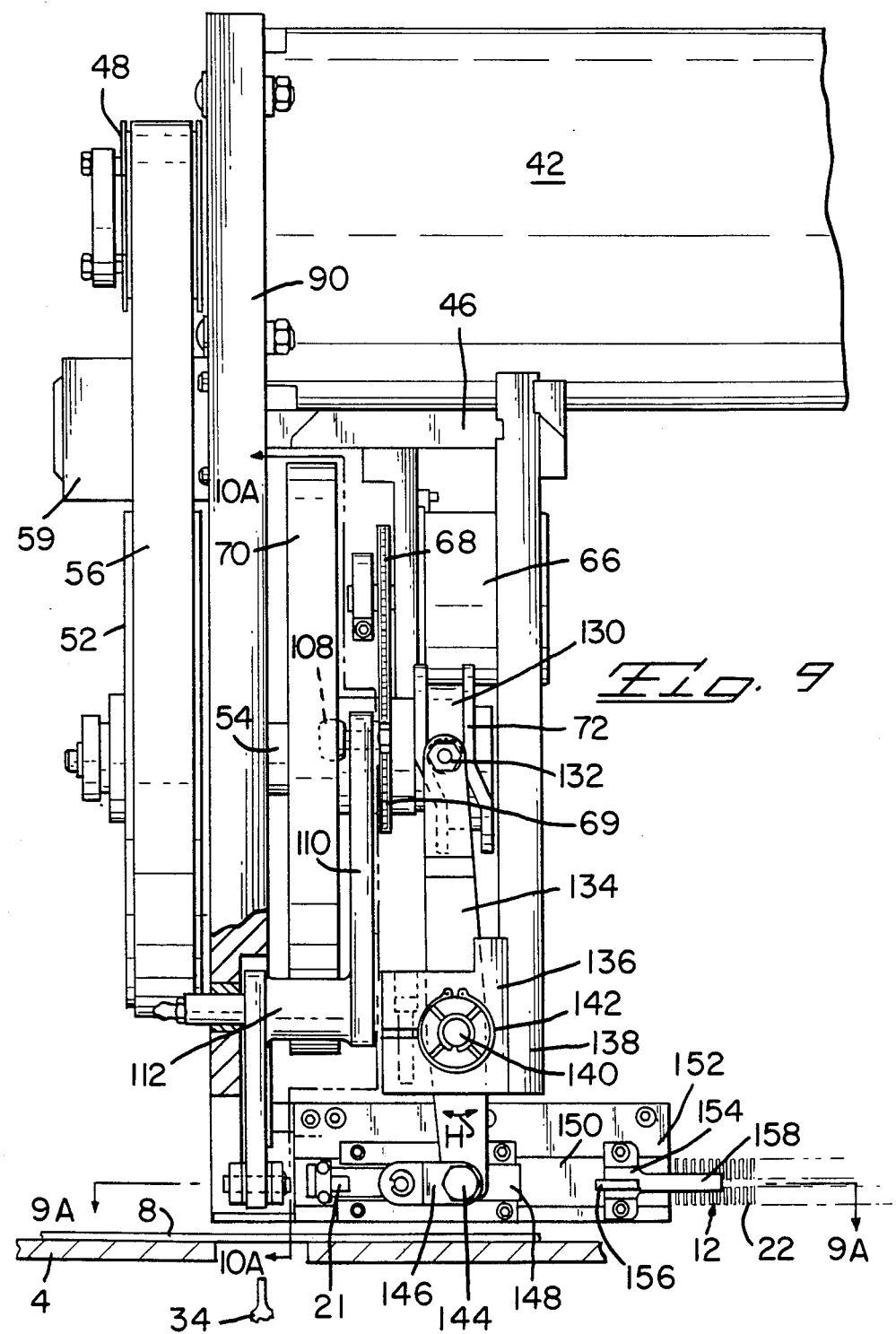

COMPONENT INSERTION APPARATUS

This invention relates to apparatus for severing components from a strip of components and inserting the separated components into a workpiece, the components being, for example, electrical terminals and the workpiece being, for example, a circuit board.

Such apparatus is disclosed in US-A-No. 3,276,653, the apparatus comprising a component insertion tool, means for feeding the strip of components incrementally towards a strip severing station with one of the components leading, means for severing the leading component from the strip at the severing station, a drive electric motor, a camshaft operatively connected thereto, camming means on the camshaft connected to the insertion tool, to the strip feeding means and the strip severing means, to cause them to be driven by the motor so that the leading component is fed to the severing station and is there severed from the strip, and is then inserted into the workpiece by the insertion tool.

In this known apparatus, the motor, which is a conventional electric motor connected to the camshaft through a single revolution clutch, and through a one-to-one ratio power transmission arrangement, the camming means comprises a series of cams spaced axially of the main camshaft, there being a separate cam for each piece of tooling to be driven, the cams, driving the tooling, each through a somewhat complex linkage.

The invention proceeds from the realization that the moving parts of such a machine can, by a suitable arrangement thereof, be reduced in mass; and the motor so selected and arranged, that the speed of the machine is substantially doubled in relation to that of the known machine.

According to the invention, in an apparatus as defined in the second paragraph of this specification, the motor is a stepping motor connected to the camshaft through step-down transmission means, the camshaft having thereon a first disc cam having formed in a face thereof at least one first endless cam track for a cam follower connected to the insertion tool and on its opposite face at least one second endless cam track for a cam follower connected to the severing means, the strip feeding means being driven by a second cam on the camshaft, which cam is spaced from the first cam in the feed direction of the strip of components, and has thereon an endless cam track for a cam follower connected to the strip feeding means, the strip severing means and the insertion tool being arranged substantially in the same plane.

The cam tracks can be so designed and the stepping motor so controlled that the motion of the driven parts is both smooth and rapid. The optimum shape for the disc cam tracks to balance out the torque demands on the motor can be achieved by computer analysis of the dynamics of the mechanism. The provision of only two cams reduces the mass of the parts to be driven by the motor, as well as the relative arrangement of the insertion tool, the severing means, the second cam and the component feed means, so that the connections between these parts can be as short and simple as possible.

The step-down transmission means can consist of a toothed belt drive between a sprocket on the motor and a sprocket on the first camshaft. The sprockets may be formed with openings to reduce their weight and the belt can be of a synthetic rubber material.

By virtue of the arrangement of the parts, the insertion tool may be in the form of a pair of jaws for gripping such a component as an electrical post and the severing means may comprise two blades, both of which are movable, without unduly increasing the inertia of the parts driven by the motor.

The workpiece, which may be moved relative to the insertion tool by means of an X-Y table, may be supported by a tool therebeneath during each insertion stroke of the insertion tool, this lower tool being driven also by a stepping motor in synchronization with the rotation of the main camshaft.

For a better understanding of the invention and so that yet further advantages thereof may be understood, an embodiment of the invention will now be described by way of example to the accompanying drawings, in which:

FIG. 1 is a perspective view of apparatus for separating components in the form of electrical post terminals from a carrier strip by which they are connected together and inserting the separated terminals one by one into a workpiece in the form of a circuit board, the apparatus being shown in a typical environment in association with an X-Y table mounted on a worktable and respective control units for the apparatus and for the X-Y table;

FIG. 7A is a view taken on the lines 7A—7A in FIG. 7;

FIG. 8 is a side view of the upper part of the apparatus, shown partly in axial section through the camshaft thereof;

FIG. 9 is a diagrammatic side view of the upper part of the apparatus taken from the opposite side to that from which FIG. 8 was taken;

FIG. 9A is a view taken on the lines 9A—9A in FIG. 9;

Figure 1:
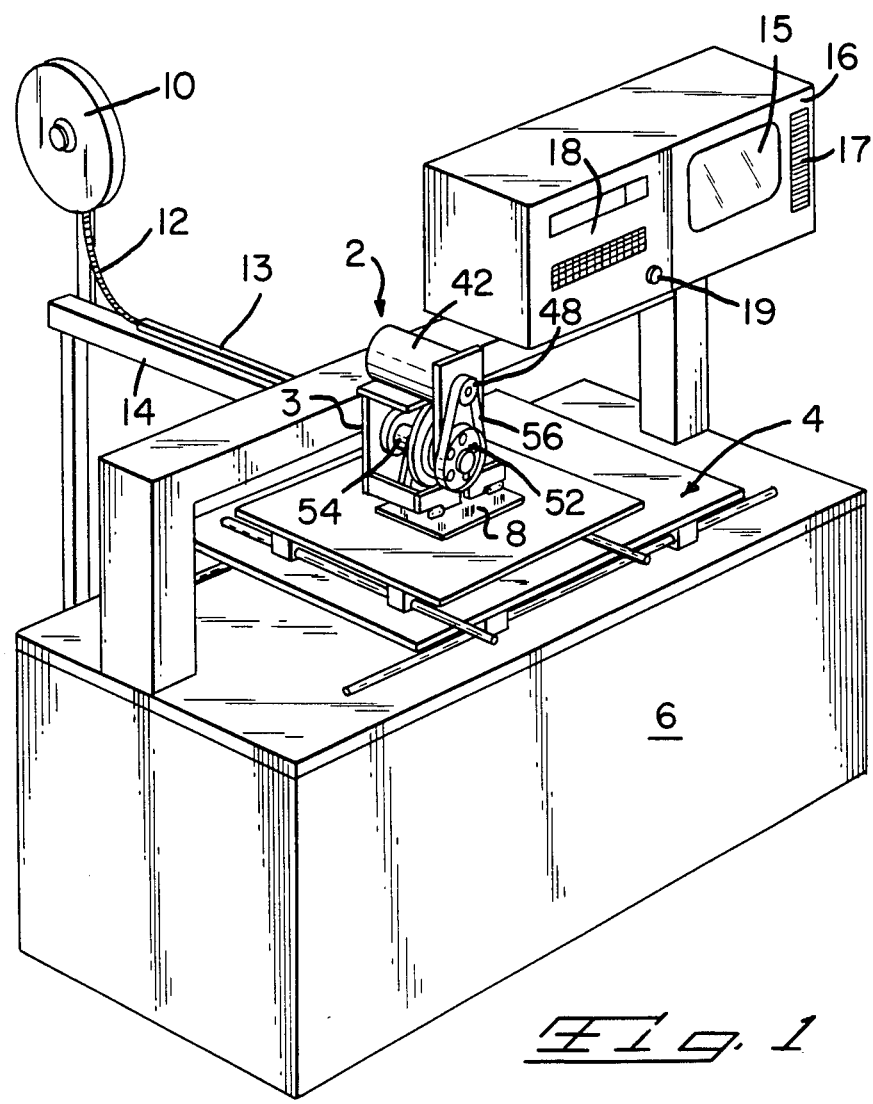

As shown in FIG. 1, the apparatus, which is generally referenced 2, has its upper part 3 mounted above an X-Y table 4, which is in turn mounted upon a workbench 6. The lower part of the apparatus, which is not shown in FIG. 1, is mounted in the workbench 6 below the X-Y table 4. A circuit board 8 is positioned on the X-Y table above an opening therein. A storage reel 10 upon which is wound a strip 12 of electrical post terminals is mounted on a bracket 14 secured to the worktable 6. The strip 12 is led through a guide channel 13 into the upper part of the apparatus from the rear (as seen in FIG. 1). Also mounted on the worktable 6 are electronic control units 16 and 18, respectively, for the insertion apparatus, and for the X-Y table. The unit 16 has a cathode ray tube display 15 and a control panel 17. Since the X-Y table and its control unit are conventional, they will not be further described in this specification.

Figure 2:
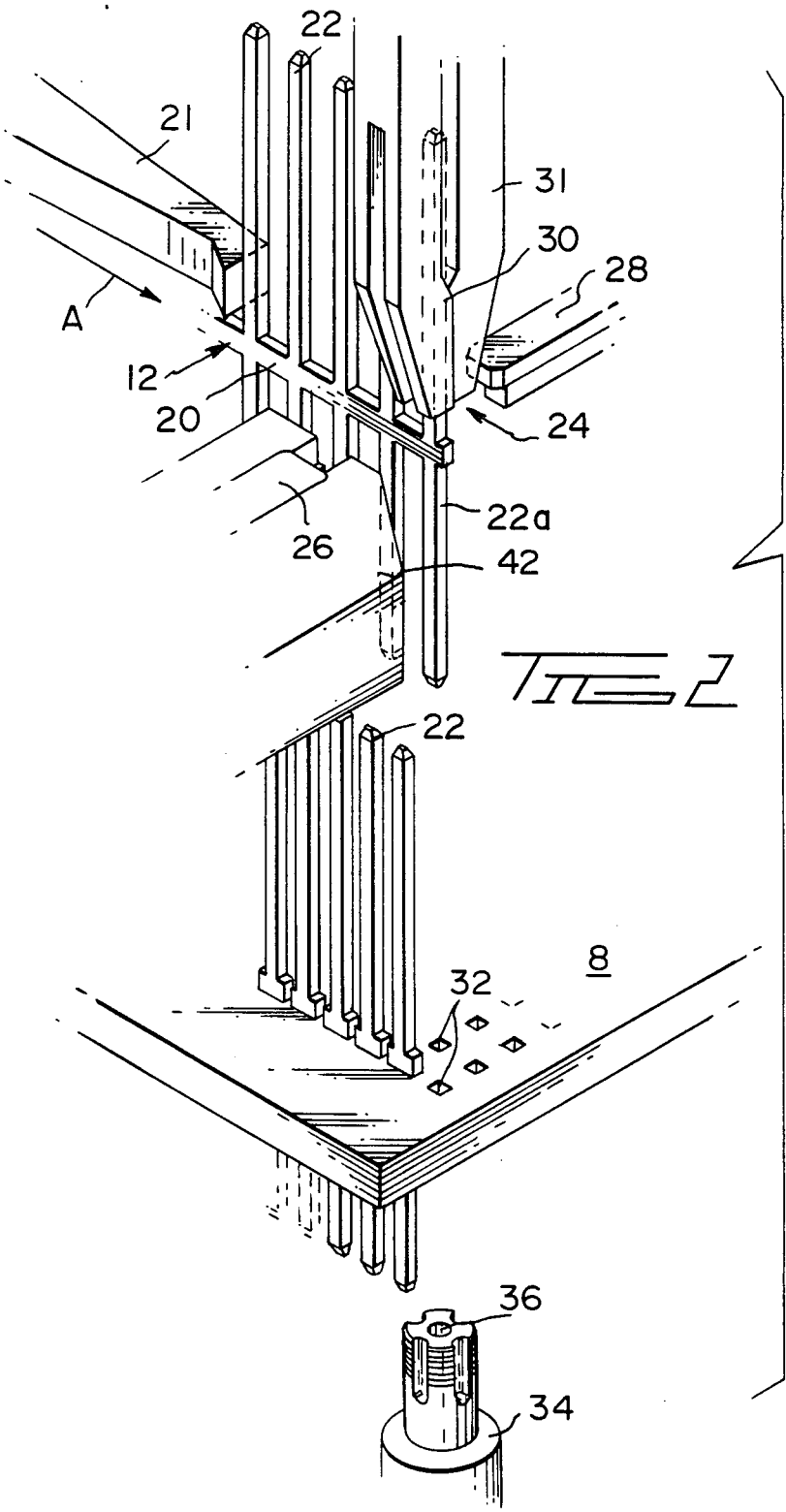
FIGS. 2 to 5 are schematic action perspective views illustrating successive stages in the operation of the basic tooling of the apparatus.
Figure 3:
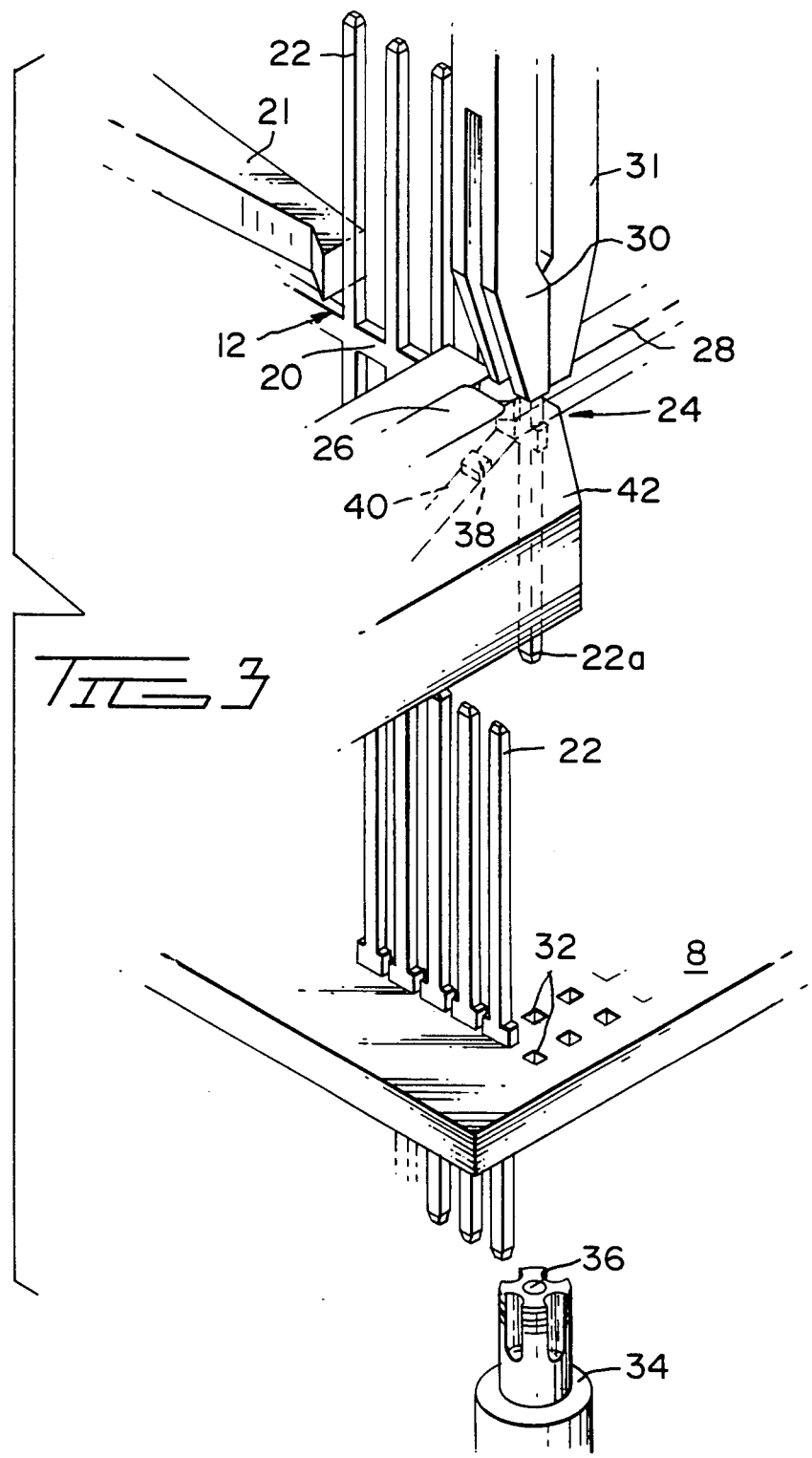
Figure 4:
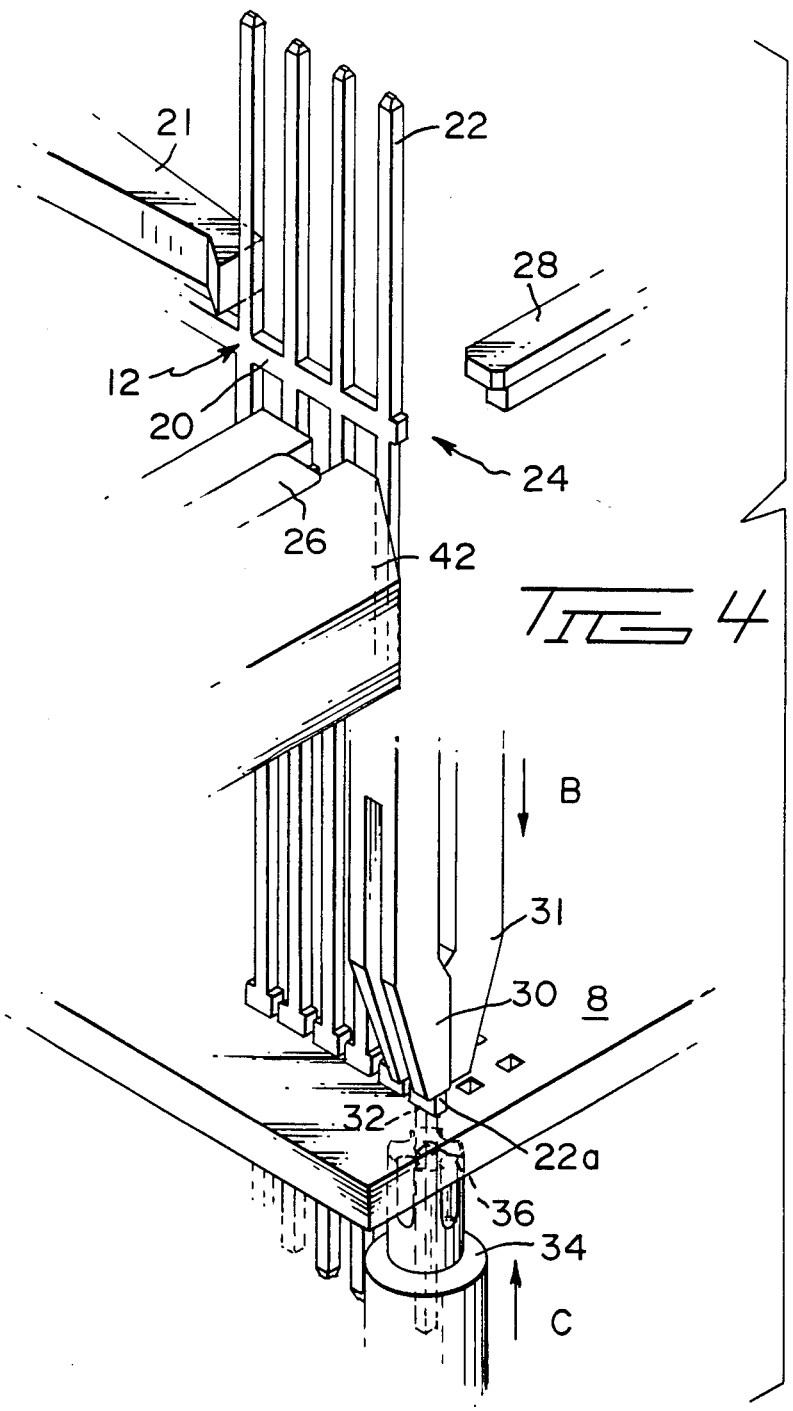
Figure 5:
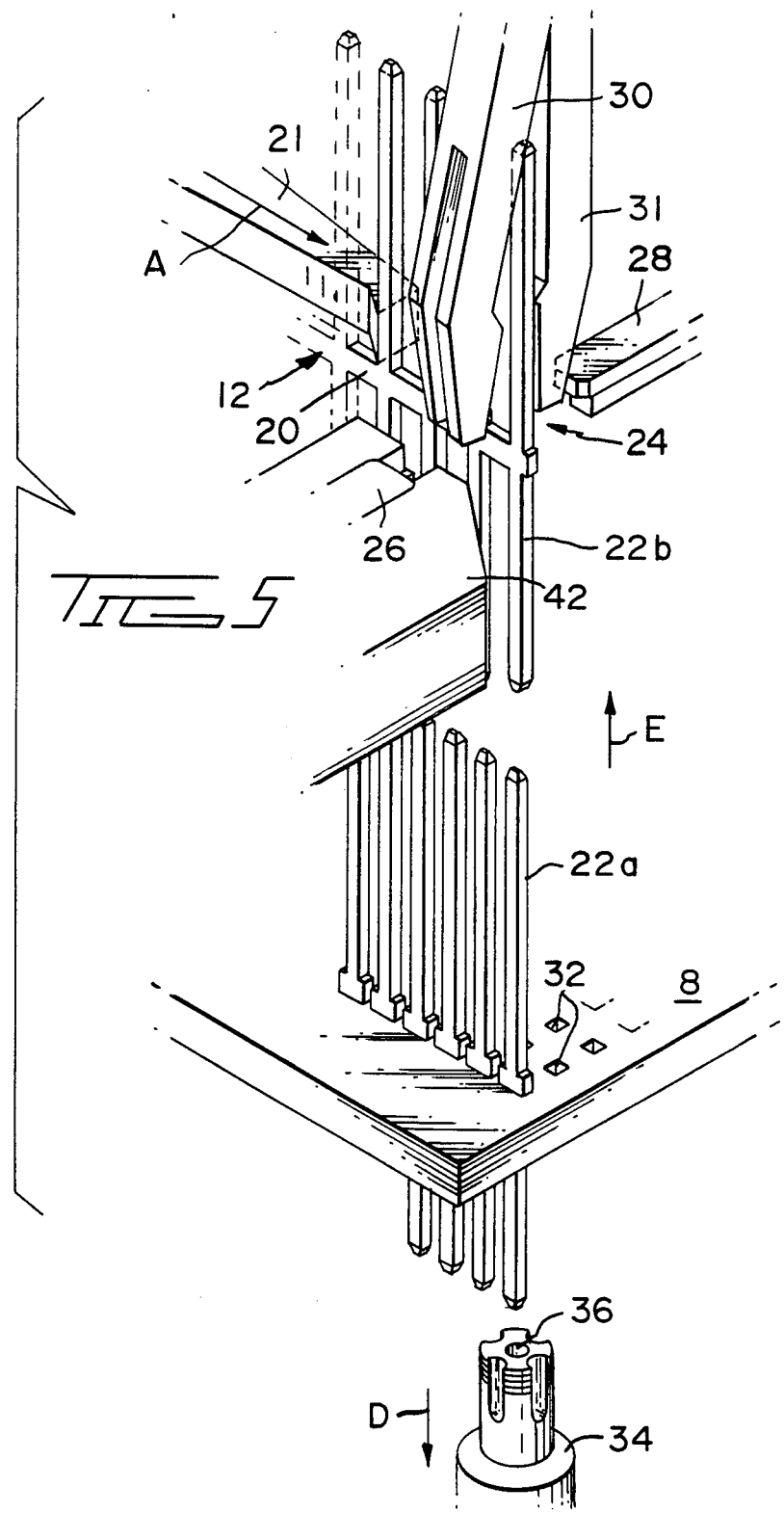

A cycle of operation of the basic tooling of the apparatus will now be described in outline with reference to FIGS. 2 to 5. The strips 12 of electrical posts comprises a carrier strip 20 which connects together, intermediate their ends, electrical posts 22. The strip having been fed by a feed pawl 21 as described below, by one increment in the direction of the arrow A in FIG. 2, during the previous cycle, the leading post 22a is positioned at a strip severing station 24 as shown in FIG. 2. At the stage of the operating cycle of the apparatus, which is shown in FIG. 2, a pair of insertion jaws 30 and 31 are in a closed position so as to grip the upper part of the leading post 22a. The leading post 22a is positioned in alignment with a hole 32 in the circuit board 8 in which the post 22a is to be inserted. A supporting tool 34 beneath the circuit board 8 is, at this stage in the cycle of operation, positioned below the board 8, as shown in FIG. 2, with a circular post-receiving opening 36 of the tool 34 in alignment with the hole 32. As shown in FIG. 3, a severing punch 26 and a severing die 28 are now moved towards one another, by means described below, to shear out the slug 38 of the carrier strip 20 by which the post 22a is connected to the next adjacent post 22, the slug being driven, by air blast means (not shown), down a channel 40 formed in a support 42 for the punch 26. As shown in FIG. 4, the punch 26 and the die 28 are now moved apart from one another, and the jaws 30 and 31 with the post 22a gripped between them descend in the direction of the arrow B so that the post 22a is inserted into the hole 32. Whilst the jaws 30 and 31 are descending, the support tool 34 rises in the direction of the arrow C so as to abut the lower face of the circuit board 8 to support it as the post 22a is inserted into the hole 32, the lower part of the post 22a being received in the hole 36 in the tool 34. As shown in FIG. 5, when the post 22a has been fully inserted into the hole in the circuit board, the tool 34 is retracted from the board 8 in the direction of the arrow D and the jaws 30 and 31 are also retracted away from the board 8 in the direction of the arrow E, sliding upwardly along the upper part of the post 22a which is now firmly fixed in the board 8. When the jaws 30 and 31 have reached their fully retracted position as shown in FIG. 5, they are opened, by means described below, to allow the strip 12 to be advanced by the pawl 21 in the direction of the arrow A so that the post 22b next following the post 22a is located at the strip severing station 24.

The upper part of the apparatus can be used independently of the lower part, for example, with a passive board support or with workpiece indexing means other than an X-Y table.

The apparatus will now be described in greater detail with reference to FIGS. 6 to 11.

Figure 6:
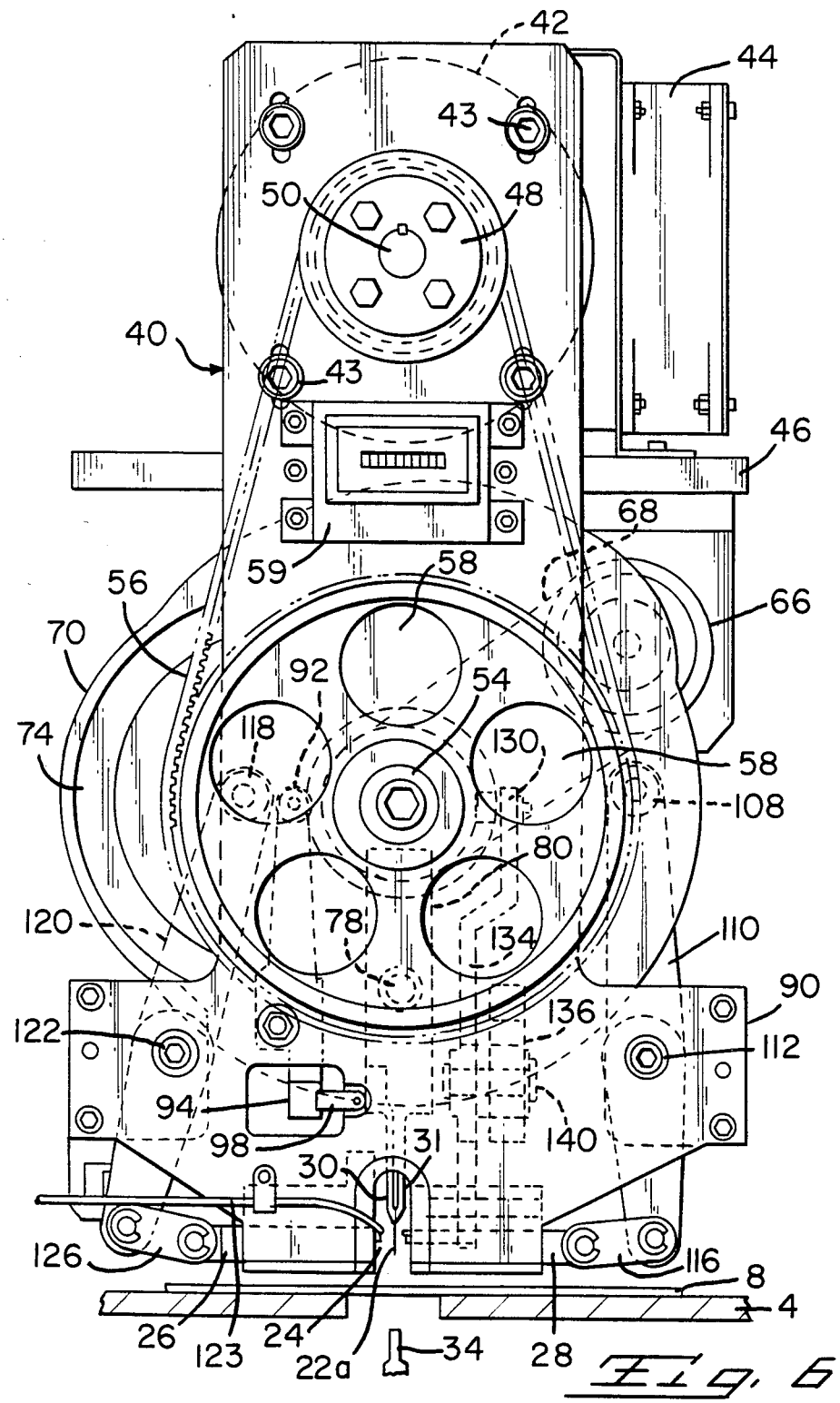
FIG. 6 is a diagrammatic frontal view of the upper part of the apparatus.
Figure 10:
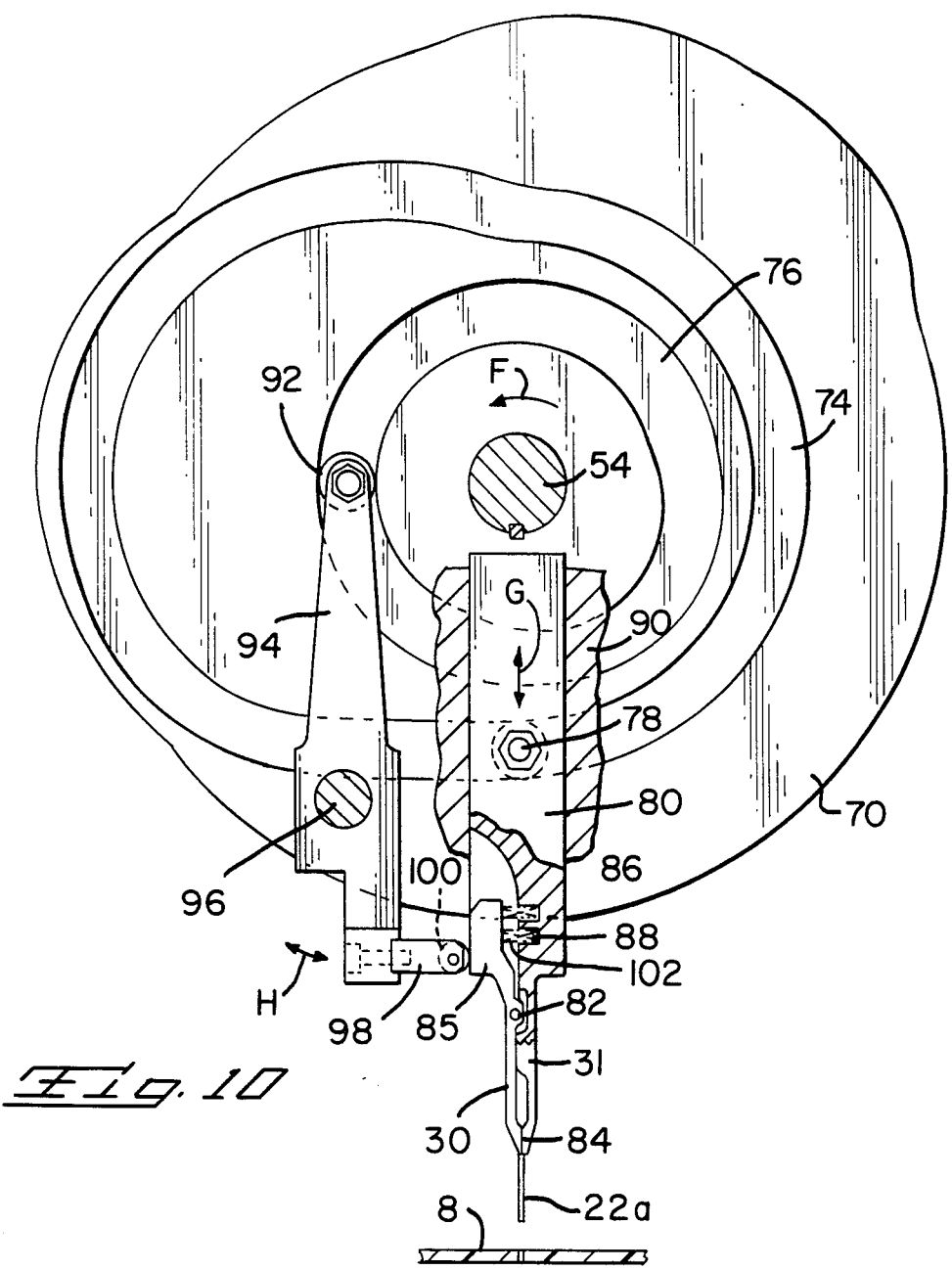
FIG. 10 is a view taken on the lines 10—10 in FIG. 8.
Figure 10A:
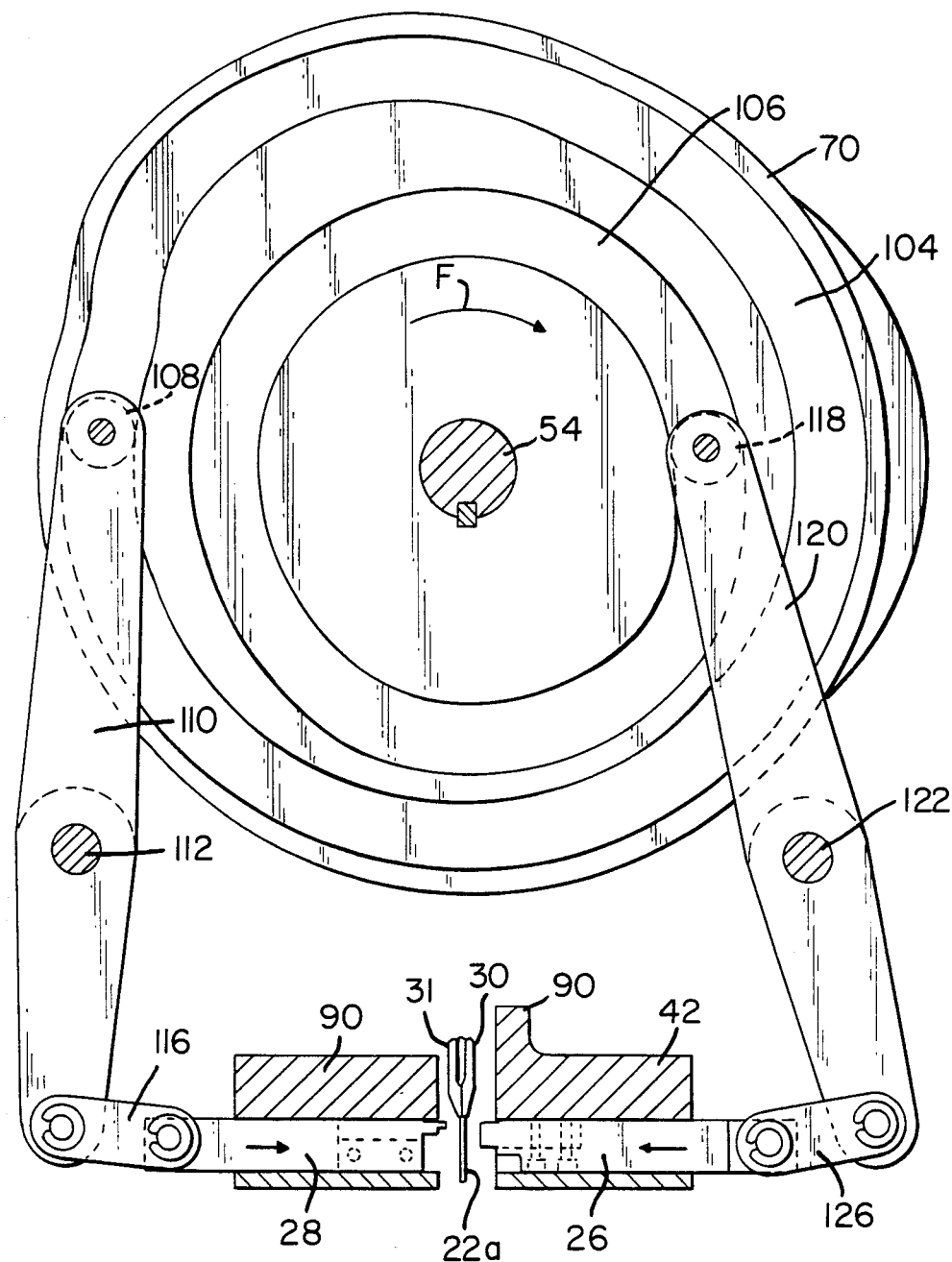
FIG. 10A is a view taken on the lines 10A—10A in FIG. 9.

The apparatus comprises a frame generally referenced 40 to the upper part of which is secured a stepping motor 42 by means of fasteners 43, as best seen in FIGS. 6 and 8. An electric fan 44 is secured to a crossplate 46 of the frame 40 to cool the motor so that maximum power may be drawn therefrom. A sprocket wheel 48 fixed to the shaft 50 of the motor 42 is connected to a drive sprocket wheel 52 fixed to a main camshaft 54 of the apparatus, by means of a toothed belt 56 which may be made of a synthetic rubber material so that its mass is minimal. The sprocket wheel has openings 58 which are provided in order to reduce its mass. Below the motor 42 is secured a revolution counter 59 for the motor 42. As best seen in FIG. 8, the main camshaft 54 is mounted in bearings 60 and 62 in the frame 40. A first absolute encoder 66 also mounted in the frame 40 is connected to the shaft 54 by means of a belt 68 and sprocket 69, to continuously monitor the angular position of the shaft 54. Fixed to the shaft 54 are a disc cam 70 through which the jaws 30 and 31 are opened and closed and driven through their vertical motions, and a barrel cam 72 through which the means, described below, for feeding the strip 12 is driven. The punch 26 and die 28 are also driven through the disc cam 70. The cam 70 has formed in its front face, as best seen in FIG. 10, a first outer cam track 74 and a second inner cam track 76. A cam follower 78 connected to a jaw carrier 80, from which the jaws 30 and 31 extend, rides in the cam track 74. The jaw 31 is formed integrally with the carrier 80 and the jaw 30 is pivoted thereto at 82. The jaws have post-gripping surfaces 84 near their free ends. That end 85 of the jaw 30, which is remote from its gripping surface 84, is provided with a pair of springs 102 which engage in, and are contained in, bores 88 in the jaw carrier 80 which is slidably mounted in a front plate 90 of the frame 40. A cam follower 92, which rides in the cam track 76, is connected to a rocker arm 94 which is pivoted to the plate 90 at 96, intermediate the ends of the arm 94. At its end remote from the cam follower 92, the arm 94 has a jaw actuating projection 98 extending normally thereof and having at its free end a roller 100 engaging the part 85 of the jaw 30. The jaw 30 is urged towards its closed position as shown in FIG. 10 by the springs 102. As the cam 70 rotates in the direction of the arrow F in FIG. 10, the jaw carrier 80 is raised and lowered as indicated by the arrow G in FIG. 10 to move the jaws 30 and 31 between the vertical positions described with reference to FIGS. 2 to 5. As indicated by the arrow H in FIG. 10, the arm 94 is rocked between the position shown in FIG. 10, in which the jaws 30 and 31 are closed, to a position in which the roller 100 compresses the springs 102 into the bores 88 against the action of the springs 102 so that the jaws 30 and 31 are opened when, as illustrated in FIG. 5, they are in their fully-raised position so that the strip 12 of posts can be advanced by a step. As shown in FIG. 10A, the cam 70 is formed on its rear side with respective inner and outer cam tracks 104 and 106. In the cam track 104 rides a cam follower 108 which is fixed to a lever 110 which is in turn pivoted about a pin 112 driving a link 116 which is in turn pivoted to the die 28 which is slidable in a channel provided in the front frame plate 90. There rides in the cam track 106 a cam follower 118 pivoted to a lever 120 which is pivoted at 122 and drives a link 126 pivoted to the punch 26 which is slidable in a channel in its support 42 which forms parts of the frame plate 90. As the cam 70 rotates in the direction of the arrow F, the punch 26 and the die 28 are moved between the open position in which they are shown in FIGS. 2, 4, 5 and 10A, to the closed severing position in which they are shown in FIG. 3 and then back to their open position. The pivot pins 112 and 122 are secured in the front plate 90, as best seen in FIG. 6.

An air blast pipe 123 (FIG. 6) is provided for the removal of a post which remains stuck to the jaw 30 or 31 after these jaws have been withdrawn from the circuit board, the air being supplied under the control of the control unit when the jaws are open.

As best seen in FIG. 9, the barrel cam 72, which is spaced rearwardly of the cam 70, has a cam track 130 in which rides a cam follower 132 fixed to a lever 134 which is pivoted intermediate its ends in a clevis 136 secured to the rear plate 138 of the frame 40 on a pivot pin 140 provided with an eccentric mounting 142 which can be rotated to adjust the throw of the link 134. The end of the lever 134 remote from the cam follower 132 is pivoted at 144 to a link 146, which is in turn pivoted to a feed slide 148 which carries the feed pawl 21 and which is slidable in a channel 150 in a feed block 152. The strip 12 extends through a strip guide channel 151 in the block 152. The pawl 21 is urged towards the strip 12 by a spring 147. A strip drag plate 154 loaded by a spring 159 and engaging the strip 12 (FIG. 9A) can be lifted by means of a handle 158 to allow a fresh strip 12 to be inserted into the channel 151. As the cam 72 rotates through one revolution, the link 134 drives the slide 148 and thus the feed pawl 21 through a return stroke to take up the next post 22 to be delivered to the severing station 24 and through a feed stroke in which the feed pawl 21 drives the post between the open jaws 30 and 31 to the severing station 24. The drag plate 154 prevents return movement of the strip 12 during the return stroke of the slide 148.

Figure 7:
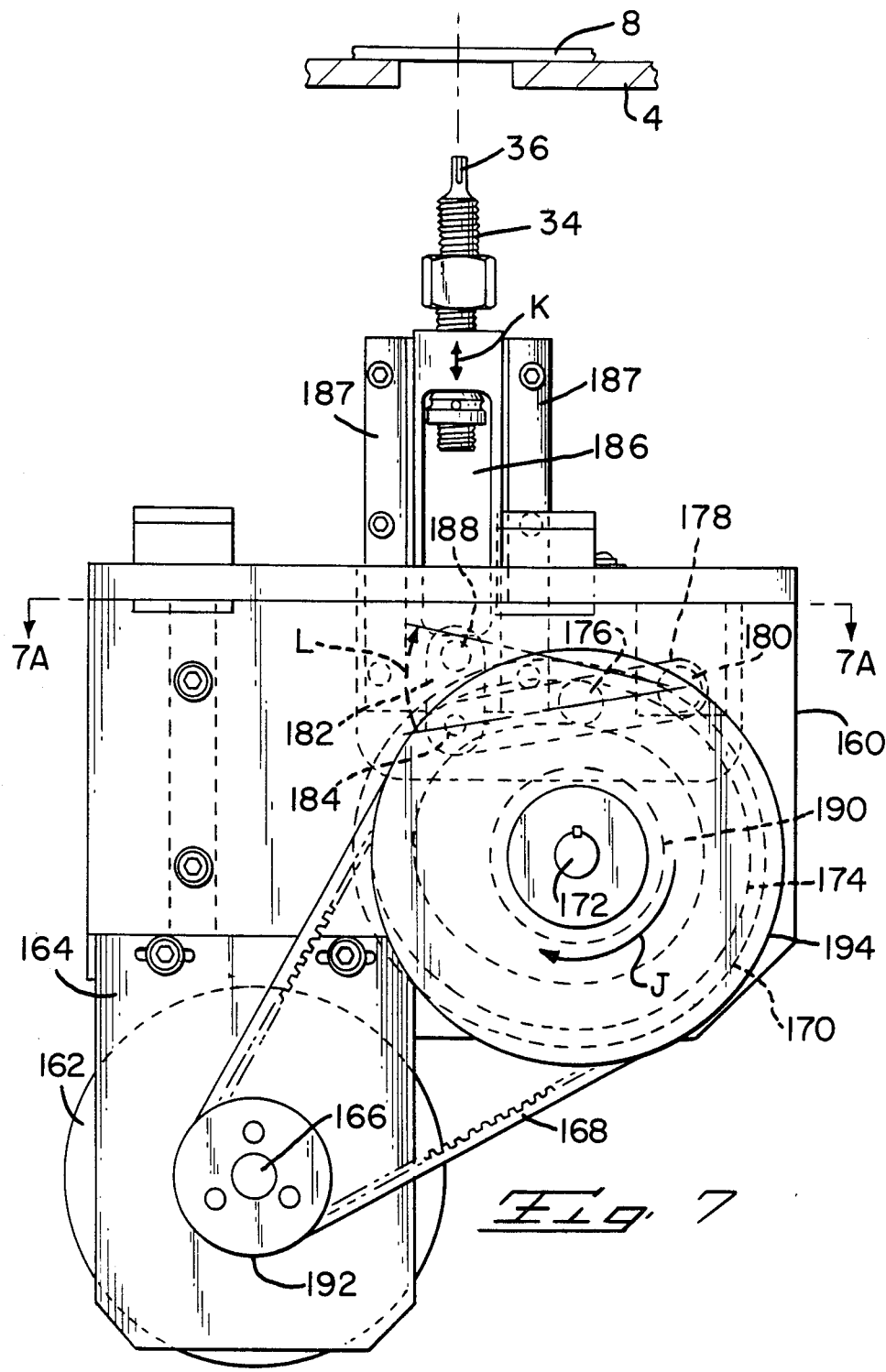
FIG. 7 is a diagrammatic frontal view of the lower part of the apparatus.

The lower part of the apparatus, which is located beneath the X-Y table 4, will now be described with reference to FIGS. 7 and 7A. This part of the apparatus comprises a frame 160 to which is mounted a further stepping motor 162 on a plate 164 secured to the plate 160. The shaft 166 of the motor 122 is connected by means of a toothed belt 168 of a synthetic rubber material to a further disc cam 170 which is mounted on a shaft 172 rotatably mounted in the frame 160, the cam 170 having a cam track 174 in which rides a cam follower 176 pivotally connected to a link 178 intermediate the ends thereof. The right-hand, as seen in FIG. 7, end of the link 178 is pivoted to the frame 160 at 180, the opposite end of the link 178 being pivoted to one end of a further link 182 at 184. The other end of the link 182 is pivoted to a slide 186 at 188, which slide carries the supporting tool 134 and is slidable between gibs 187. As the cam 170 is rotated by the motor 162 in the direction of the arrow J in FIG. 7, the tool 34 is moved by the slide 186 between its retracted position and its board supporting position in the manner described with reference to FIGS. 2 to 5. The shaft 172 is connected to an absolute encoder 190, which continuously measures the angular position of the shaft 172. The belt 168 is engaged about a sprocket wheel 192 on the motor shaft 166 and a sprocket wheel 194 on the camshaft 172. The motion of the slide 186 is indicated by the arrows K in FIG. 7, the motion of the pivot point 184 being indicated by the arrow L in FIG. 7.

Figure 11:
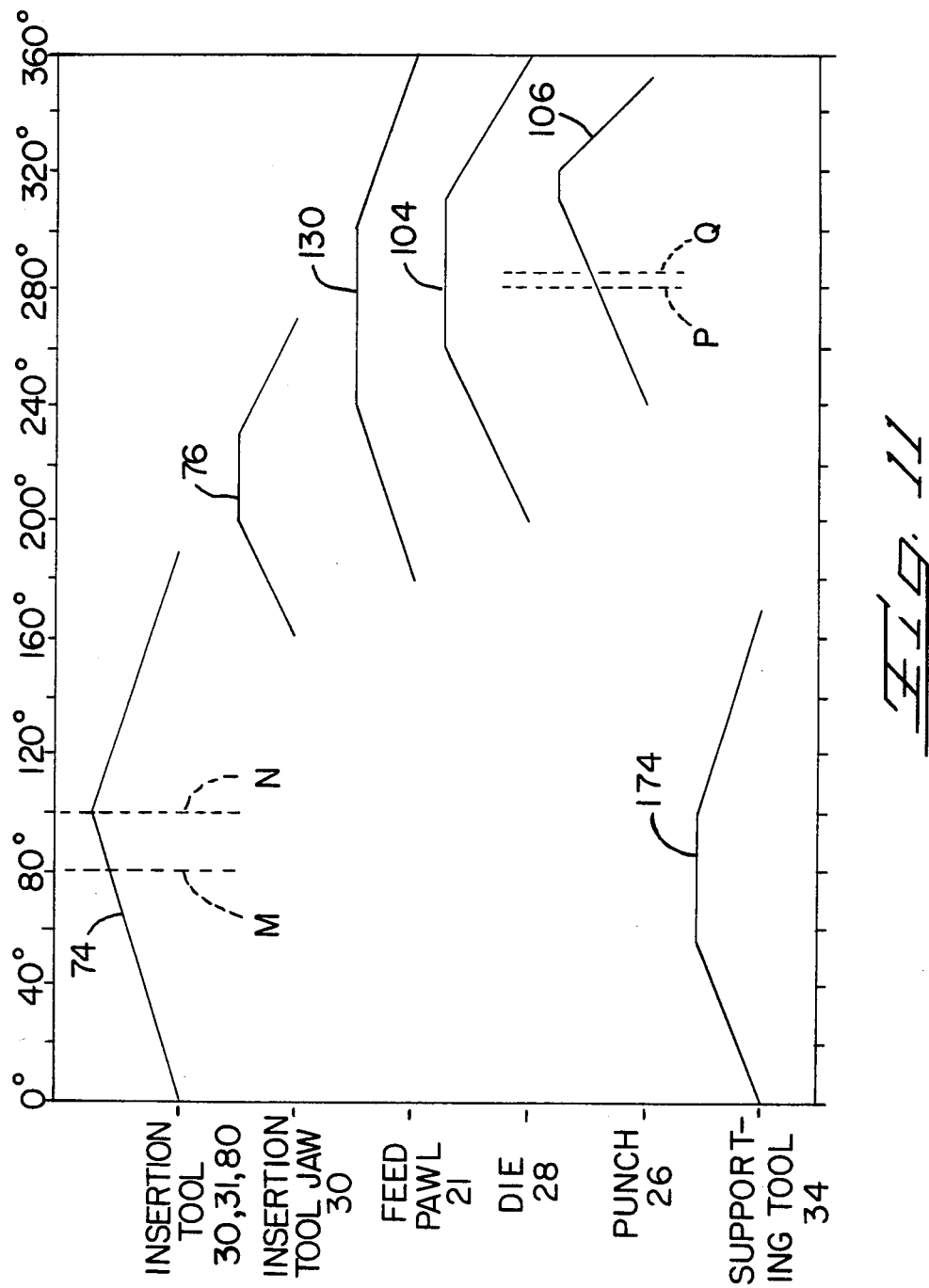
FIG. 11 is a timing diagram illustrating the sequential operation of the parts of the apparatus.

FIG. 11 is a timing diagram which indicates how the tooling described above is synchronized by means of the cam tracks, this tooling as a lot being synchronized electronically. In FIG. 11, the angular positions of the camshafts 54 and 172 are plotted against the movement of the tooling as represented by schematic developed views of the cam tracks 74, 76, 130, 104 and 106, and 174. As will be apparent from FIG. 11, at the start of an operating cycle of the apparatus, with the camshafts at 0°, the insertion tool (cam track 74) starts to descend so as to insert the post 22a into the hole 32, the insertion of the post beginning at broken line M and full insertion being indicated by broken line N. As the insertion tool is being retracted towards its uppermost position, the roller 100 (cam track 76) begins to open the jaw 30, which is fully opened, for a dwell period, shortly after the insertion tool reaches its fully raised position. Whilst the jaw 30 is still in its open position, the feed pawl 21 (cam track 130) advances the strip 12 so that the leading post is positioned at the severing station 24, after which the jaw 30 is closed so that the jaws 30 and 31 grip the post, the jaw 30 having dwelt in its open position during the greater part of the feed stroke of the pawl 21 which dwells in its fully advanced position during the strip severing operation. As the jaw 30 is closed, the die 28 (cam track 104) is advanced against the carrier strip 20 and dwells in such position whilst the punch 26 (cam track 106) severs the carrier strip as indicated by the broken lines P and Q, after which the insertion tool descends again. As mentioned above, the board supporting tool 34 (cam track 174) is moved to its advanced, supporting, position prior to the insertion of the post into the hole 32 and is then retracted to allow the X-Y table to be indexed, following a dwell period during the insertion operation.

Figure 12:
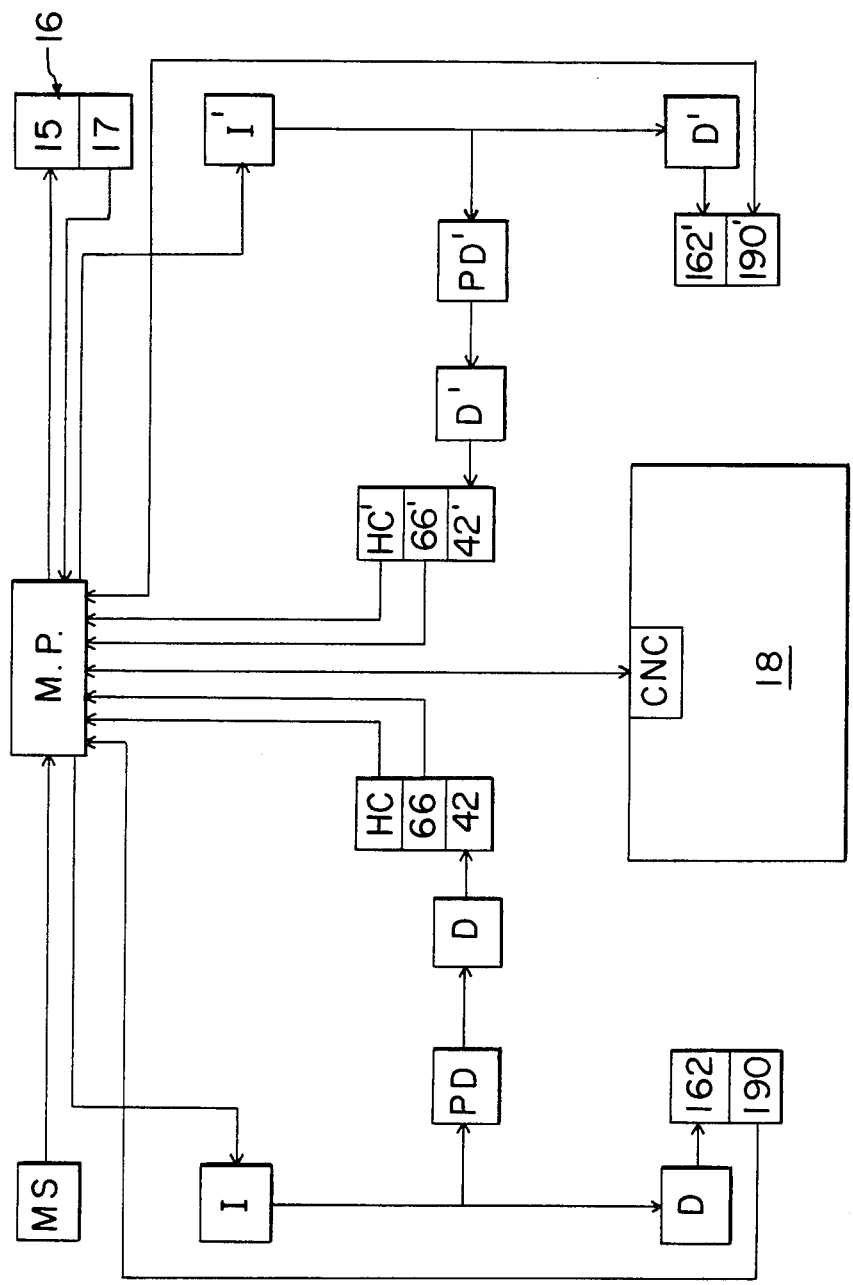
FIG. 12 is a block schematic diagram of the control circuit of the apparatus.

FIG. 12 is a block schematic diagram of the control unit 16 for the apparatus 2. Certain parts of the unit are duplicated to allow for the case where the apparatus is provided with dual insertion tooling for operation with the same X-Y table. The reference numerals of the duplicated parts are indicated by a prime symbol. In FIG. 12, items not previously referred to are referenced as follows: a central microprocessor is referenced MP, miscellaneous sensors are referenced MS, indexing pulse transmitters for the stepping motors as I, drivers for the motors as D, head code means as HC, and a synchronizing control device for the X-Y table as CNC. The miscellaneous sensors MS, which are for the pre-inspection of the strip 12, are arranged in the feed track for the detection of a splice or overlap in the strip 12, a post that protrudes from the plane of the strip 12, and the exhaustion of the supply of the strip 12, and for other desired inspection purposes.

The encoders 66 and 190, which continuously measure the angular positions of the shafts 54 and 172, respectively, of the motors 42 and 162 may be absolute optical encoders or electromagnetic resolvers.

The head code means is an electrical connector which has been jumpered to select a desired program for the operation of the apparatus from the memory of the microprocessor and the appropriate angular positions of the shaft 54 for the program. There is no head code means for the motor 162, because the program for the shaft 54 dominates. The head code means may also indicate to the microprocessor as to whether the encoders are properly connected to the control circuit.

The computer numeric control CNC for the X-Y table is connected by a "hand shaking" line to the microprocessor MP for the synchronization of the operation of the apparatus 2 and that of the X-Y table.

The indexer I is a pulse generator which supplies the stepping motors 42 and 162 with actuating pulses via the respective impedance matching drivers D. The stepping motors 42 and 162 turn their shafts through angles predetermined by the number of pulses fed thereto and the indexer is programmed to produce the correct number of pulses for each cycle of operation of the apparatus 2.

A pulse divider PD may be interposed between the indexer I and one of the motors if the number of pulses required by that motor is different from that required by the other.

The cathode ray display 15 indicates data relevant to the operation of the apparatus, under the control of the microprocessor.

The microprocessor receives data from the miscellaneous sensors, the head code, the encoders 66 and 190, the computer numeric control for the X-Y table, and the control panel 17.

On the control panel 17 are a number of, e.g., five, pushbuttons, the function of which will depend on the information displayed on the display 15. For example, according to the information displayed, a pushbutton may become a start button, or a "jog" button, or a stop button, or it may become a means of answering a question posed on the display.

When a main machine start button 19 on the unit 18 is pressed, the microprocessor MP compares data from its own memory as determined by the head code means HC with that supplied by the encoders 66 and 190. If the shafts 54 and 172 are not in their home positions, as determined by the selected program, the microprocessor will not actuate the indexer so that the motors 42 and 162 do not start, and the actual angular positions of the shaft 54 and 172 are indicated on the cathode ray tube display 15. If this should occur, the display instructs the operator which button on the panel 17 to press in order to return the shafts 54 and 172 automatically to their home positions, so that the apparatus 2 is ready to be started.

The motors 42 and 162 will also not be started if the microprocessor receives error data supplied by one of the miscellaneous sensors MS, the head code means HC, or the computer numeric control CNC for the X-Y table, and the fault is indicated on the cathode ray tube display 15 as well as instructions for clearing the fault.

If the microprocessor receives error data whilst the apparatus 2 is in operation, it deactivates the indexer I and thus the stepping motors, and the fault is indicated on the cathode ray tube display 15.

Note that while the above described embodiment contemplates an alternating current stepping motor having open loop feedback, the tooling position being checked by means of encoders, a DC servomotor or other closed loop drive may also be used. This could use the pulses out of an indexer or a resolver tachometer to provide feedback for motor synchronization. While this departs from the invention embodied in the above described control unit, it is presented as alternate control means for the described insertion apparatus.

We claim:

1. Apparatus for severing components from a strip of components and inserting each severed component into a workpiece, the apparatus comprising a component insertion tool, means for feeding a strip of components incrementally towards the strip severing station with one of the components leading, means for severing the leading component from the strip at the severing station, a drive electric motor, a camshaft operatively connected to the motor, camming means on the camshaft connected to the insertion tool, to the strip feeding means and to the strip severing means, to cause them to be driven by the motor so that the leading component is fed to the severing station and is there severed from the strip, and is then inserted into the workpiece by the insertion tool; in which apparatus the motor is connected to the camshaft through step-down transmission means, the camshaft having thereon a first disc cam having formed in a face thereof at least one endless first cam track for a cam follower connected to the insertion tool and on its opposite face at least one endless second cam track for a cam follower connected to the severing means, the strip feeding means being driven by a second cam on the camshaft, which cam is spaced from the first cam in the feed direction of the strip of components and has thereon an endless cam track for a cam follower connected to the strip feeding means, the strip severing means and the insertion tool, being arranged substantially in the same plane.

2. Apparatus according to claim 1, in which the insertion tool comprises a pair of jaws for gripping the workpiece between them, one face of the disc cam being formed with a further endless cam track receiving a cam follower connected to a jaw of the insertion tool, the cam tracks on the one face of the disc cam being so formed that at the end of each operating cycle of the apparatus the insertion tool is placed in a retracted position remote from the workpiece and the jaws of the insertion tool are first placed in an open position to allow the leading component to be fed between the jaws of the insertion tool, and are then closed to grip the component, the jaws being subsequently advanced to insert the component into the workpiece, the cam track on said opposite face of the disc cam being so formed that the severing means severs the leading component from the strip whilst the leading component is gripped by the jaws of the insertion tool.

3. Apparatus according to claim 1 in which the severing means comprises a severing punch and a severing die arranged in substantially coplanar relationship and being arranged to be driven in opposite directions against the strip of components, said opposite face of the disc cam being formed with an endless cam track for a cam follower connected to the punch and an endless cam track for a cam follower connected to the die, the punch and the die being slidable in a frame plate of the apparatus.

4. Apparatus according to claim 1, in which the shaft of the motor is arranged in spaced parallel relationship to the camshaft and is provided with a first sprocket wheel connected to a second sprocket wheel on the camshaft by means of a toothed belt constituting the step-down transmission means, the belt being of a rubber-like material and the second sprocket wheel being apertured to reduced its mass.

5. Apparatus according to claim 1, which further comprises a workpiece supporting tool driven by a further motor through a further disc cam on a further camshaft, the further disc cam having formed in a face thereof a further endless cam track receiving a cam follower connected to the workpiece supporting tool, the further cam track being so formed that, prior to the insertion of the component into the workpiece, the supporting tool is driven against the workpiece by the motor to support the workpiece.

6. Apparatus according to claim 5, in which said motors are stepping motors each camshaft is provided with an encoder for continuously monitoring the angular position of the camshaft, means being provided for comparing the outputs of the encoders and for producing a signal for stopping the apparatus if the angular position of one camshaft differs from that of the other.

7. Apparatus according to claim 2, in which means are provided at the severing station for removing scrap therefrom between predetermined angular positions of the camshafts, means being provided for synchronizing the operation of the scrap removing means with that of the jaws.

* * * * *